US010310335B2

(12) United States Patent
Georgiou et al.

(10) Patent No.: US 10,310,335 B2
(45) Date of Patent: Jun. 4, 2019

(54) REDUCING ORDERS OF DIFFRACTION PATTERNS

(71) Applicant: Microsoft Technology Licensing, LLC, Redmond, WA (US)

(72) Inventors: Andreas Georgiou, Cambridge (GB); Joel S. Kollin, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 236 days.

(21) Appl. No.: 15/257,581

(22) Filed: Sep. 6, 2016

(65) Prior Publication Data

US 2017/0248825 A1 Aug. 31, 2017

Related U.S. Application Data

(60) Provisional application No. 62/301,425, filed on Feb. 29, 2016.

(51) Int. Cl.
*G02F 1/1335* (2006.01)
*G02F 1/1343* (2006.01)
(Continued)

(52) U.S. Cl.
CPC .... *G02F 1/134309* (2013.01); *G02F 1/13363* (2013.01); *G02F 1/13439* (2013.01);
(Continued)

(58) Field of Classification Search
CPC ........ G02F 1/133504; G02F 1/134309; G02F 1/133553; G02F 1/13363; G02F 1/133345;
(Continued)

(56) References Cited

U.S. PATENT DOCUMENTS 4,012,119 A 3/1977 Adams et al.
4,826,300 A 5/1989 Efron et al.
(Continued)

FOREIGN PATENT DOCUMENTS

GB 2461294 A 12/2009
WO 9735223 A1 9/1997
(Continued)

OTHER PUBLICATIONS

Paschotta, R., "Volume Bragg Gratings" Encyclopedia of Laser Physics and Technology, vol. 1, Jul. 31, 2016, 3 Pages.
(Continued)

*Primary Examiner* — Nathanael R Briggs
*Assistant Examiner* — William D Peterson
(74) *Attorney, Agent, or Firm* — Alleman Hall Creasman & Tuttle LLP

(57) ABSTRACT

Examples are disclosed relating to reducing orders of diffraction patterns in phase modulating devices. An example phase modulating device includes a phase modulating layer having first and second opposing sides, a common electrode adjacent the first side of the phase modulating layer, a plurality of pixel electrodes adjacent the second side of the phase modulating layer, and blurring material disposed between the phase modulating layer and the pixel electrodes. In the example phase modulating device, the blurring material is configured to smooth phase transitions in the phase modulating layer between localized areas associated with the pixel electrodes, the pixel electrodes have a pixel pitch by which the pixel electrodes are distributed along the phase modulating layer, and the pixel electrodes are separated from one another by an inter-pixel gap, where the ratio of the inter-pixel gap to the pixel pitch is between 0.50 and 1.0.

20 Claims, 5 Drawing Sheets

(51) Int. Cl.
| | |
|---|---|
| *G02F 1/13363* | (2006.01) |
| *G02F 1/1333* | (2006.01) |
| *G03H 1/02* | (2006.01) |
| *G03H 1/22* | (2006.01) |
| *B82Y 30/00* | (2011.01) |
| *G02F 1/29* | (2006.01) |
| *G02B 5/08* | (2006.01) |
| *H01L 51/00* | (2006.01) |
| *H01L 51/10* | (2006.01) |

(52) U.S. Cl.
CPC .. *G02F 1/133345* (2013.01); *G02F 1/133504* (2013.01); *G02F 1/133553* (2013.01); *G03H 1/02* (2013.01); *G03H 1/2202* (2013.01); *B82Y 30/00* (2013.01); *G02B 5/0816* (2013.01); *G02F 1/133509* (2013.01); *G02F 1/292* (2013.01); *G02F 2001/13356* (2013.01); *G02F 2001/133638* (2013.01); *G02F 2201/121* (2013.01); *G02F 2201/123* (2013.01); *G02F 2201/305* (2013.01); *G02F 2202/36* (2013.01); *G02F 2202/42* (2013.01); *G02F 2203/12* (2013.01); *G02F 2413/01* (2013.01); *G03H 2001/0224* (2013.01); *G03H 2223/20* (2013.01); *G03H 2223/24* (2013.01); *G03H 2223/50* (2013.01); *G03H 2223/53* (2013.01); *G03H 2225/32* (2013.01); *G03H 2225/52* (2013.01); *G03H 2225/55* (2013.01); *H01L 51/0048* (2013.01); *H01L 51/102* (2013.01)

(58) Field of Classification Search
CPC ........... G02F 1/13439; G02F 1/133509; G02F 1/292; G02B 5/0278; G02B 5/0816
USPC ......................................................... 349/112
See application file for complete search history.

(56) References Cited

U.S. PATENT DOCUMENTS

| | | | |
|---|---|---|---|
| 5,331,446 | A | 7/1994 | Hirai et al. |
| 5,815,222 | A | 9/1998 | Matsuda et al. |
| 6,043,910 | A | 3/2000 | Slinger |
| 6,075,512 | A | 6/2000 | Patel et al. |
| 6,404,538 | B1 | 6/2002 | Chen et al. |
| 6,512,560 | B2 | 1/2003 | Ohtake et al. |
| 6,512,566 | B1 | 1/2003 | Yamagishi et al. |
| 6,690,447 | B1 | 2/2004 | Stephenson et al. |
| 6,760,135 | B1 | 7/2004 | Payne et al. |
| 7,876,405 | B2 | 1/2011 | Ito et al. |
| 8,218,211 | B2 | 7/2012 | Kroll et al. |
| 8,487,980 | B2 | 7/2013 | Kroll et al. |
| 8,553,302 | B2 | 10/2013 | Leister |
| 8,625,183 | B2 | 1/2014 | Khan |
| 9,122,244 | B2 | 9/2015 | Lee et al. |
| 2004/0227703 | A1 | 11/2004 | Lamvik et al. |
| 2005/0243258 | A1 | 11/2005 | Oh |
| 2009/0244415 | A1 | 10/2009 | Ide |
| 2010/0056274 | A1 | 3/2010 | Uusitalo et al. |
| 2010/0073744 | A1 | 3/2010 | Zschau et al. |
| 2010/0103485 | A1 | 4/2010 | Haussler |
| 2010/0157399 | A1 | 6/2010 | Kroll et al. |
| 2013/0022222 | A1 | 1/2013 | Zschau et al. |
| 2013/0202297 | A1 | 8/2013 | Martinelli et al. |
| 2013/0222384 | A1 | 8/2013 | Futterer |
| 2014/0104664 | A1 | 4/2014 | Lee et al. |
| 2014/0168735 | A1 | 6/2014 | Yuan et al. |
| 2015/0036199 | A1 | 2/2015 | Leister et al. |
| 2015/0309472 | A1* | 10/2015 | Takiguchi ............... G02B 26/06 359/9 |
| 2015/0378080 | A1 | 12/2015 | Georgiou et al. |
| 2016/0195720 | A1 | 7/2016 | Travis et al. |
| 2016/0379606 | A1 | 12/2016 | Kollin et al. |

FOREIGN PATENT DOCUMENTS

| | | | |
|---|---|---|---|
| WO | 2008049917 | A1 | 5/2008 |
| WO | 2008/155563 | * | 6/2008 |
| WO | 2008155563 | A1 | 12/2008 |
| WO | 2012103559 | A1 | 8/2012 |

OTHER PUBLICATIONS

IPEA European Patent Office, Second Written Opinion Issued in PCT Application No. PCT/US2016/039142, dated Mar. 31, 2017, WIPO, 7 pages.
ISA European Patent Office, International Search Report and Written Opinion Issued in PCT Application No. PCT/US2017/019231, dated May 26, 2017, WIPO, 14 Pages.
"100% Fill Factor White Paper", Boulder Nonlinear Systems, Inc., Available Online at http://www.auniontech.com/uploadfile/2014/01/100%20Fill%20Factor%20White%20Paper.pdf, Jan. 2008, 2 Pages.
Reichelt, S. et al., "Holographic 3-D Displays—Electro-holography within the Grasp of Commercialization", Chapter 29 in Book: Advances in Lasers and Electro Optics, InTech, Published online Apr. 1, 2010, 29 pages.
Zschau, E. et al., "Generation, encoding and presentation of content on holographic displays in real time", in SPIE Proceedings vol. 7690: Three-Dimensional Imaging, Visualization, and Display 2010 and Display Technologies and Applications for Defense, Security, and Avionics IV, May 14, 2010, 14 pages.
Yaras, F. et al., "State of the Art in Holographic Displays: A Survey", In Journal of Display Technology, vol. 6, Issue 10, Oct. 2010, First published May 27, 2010, 12 pages.
Mirza, K. et al., "Key Challenges to Affordable See Through Wearable Displays: The Missing Link for Mobile AR Mass Deployment", Available at: http://optinvent.com/HUD-HMD-benchmark, Available as early as Jun. 13, 2013, Retrieved on Mar. 10, 2015, 8 pages.
Willekens, O. et al., "Paper No. S1.3: Lead Zirconate Titanate-Based Transmissive Liquid Crystal Lens Approach", In Proceedings of Society for Information Display EuroDisplay 2015, Sep. 21, 2015, Het Pand, Ghent, Belgium, 1 page.
Travis, A., "Holographic Display", U.S. Appl. No. 14/921,864, filed Oct. 23, 2015, 38 pages.
ISA European Patent Office, International Search Report and Written Opinion issued in PCT Application No. PCT/US2016/039142, dated Dec. 9, 2016, WIPO, 17 pages.
Serati, et al., "Advances in Liquid Crystal Based Devices for Wavefront Control and Beamsteering", In Proceedings of SPIE, vol. 5894, Sep. 6, 2005, 14 pages.
"Spatial Light Modulators—XY Series", Retrieved on: Feb. 23, 2016 Available at: http://bnonlinear.com/pdf/XYSeriesDS0909.pdf.
U.S. Appl. No. 14/754,451, Kollin, et al., "Holographic Near Eye Display", filed Jun. 29, 2015.
Zhang, et al., "Fundamentals of phase-only liquid crystal on silicon (LCOS) devices" Light: Science & Applications. Published Oct. 24, 2014. 10 pages.

* cited by examiner

REDUCING ORDERS OF DIFFRACTION PATTERNS

CROSS REFERENCE TO RELATED APPLICATIONS

This application claims priority to U.S. Provisional Application No. 62/301,425, filed Feb. 29, 2016, and entitled REDUCING ORDERS OF DIFFRACTION PATTERNS, the entirety of which is hereby incorporated herein by reference.

BACKGROUND

An optical system may include an image forming optic illuminated by an illumination source to produce a viewable image. Image forming optics may be transmissive, such that an image is formed by modulating light passing through the image-forming optic, or reflective, such that an image is formed by modulating light reflected from the image-forming optic.

DETAILED DESCRIPTION

Phase modulating devices, such as electrically addressed spatial light modulators (EA-SLM), may form an intensity distribution using diffraction. The intensity distribution may be an image that is used as an information display, for projecting an array of spots for depth sensing or used even for illumination purposes in vehicles and buildings. The phase modulating device can be either transmissive (like many large panel liquid crystal displays (LCDs)) or reflective, like Liquid Crystal over Silicon (LCoS) devices.

Figure 1:
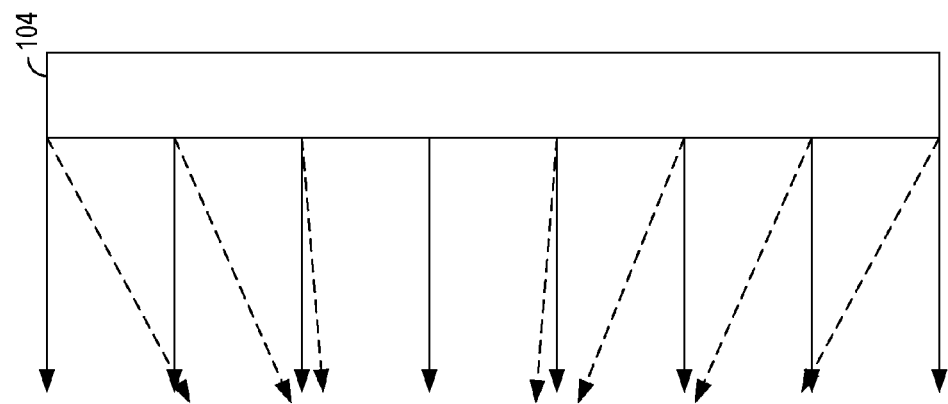
FIG. 1 shows an example hologram and image output representation.
Figure 1:
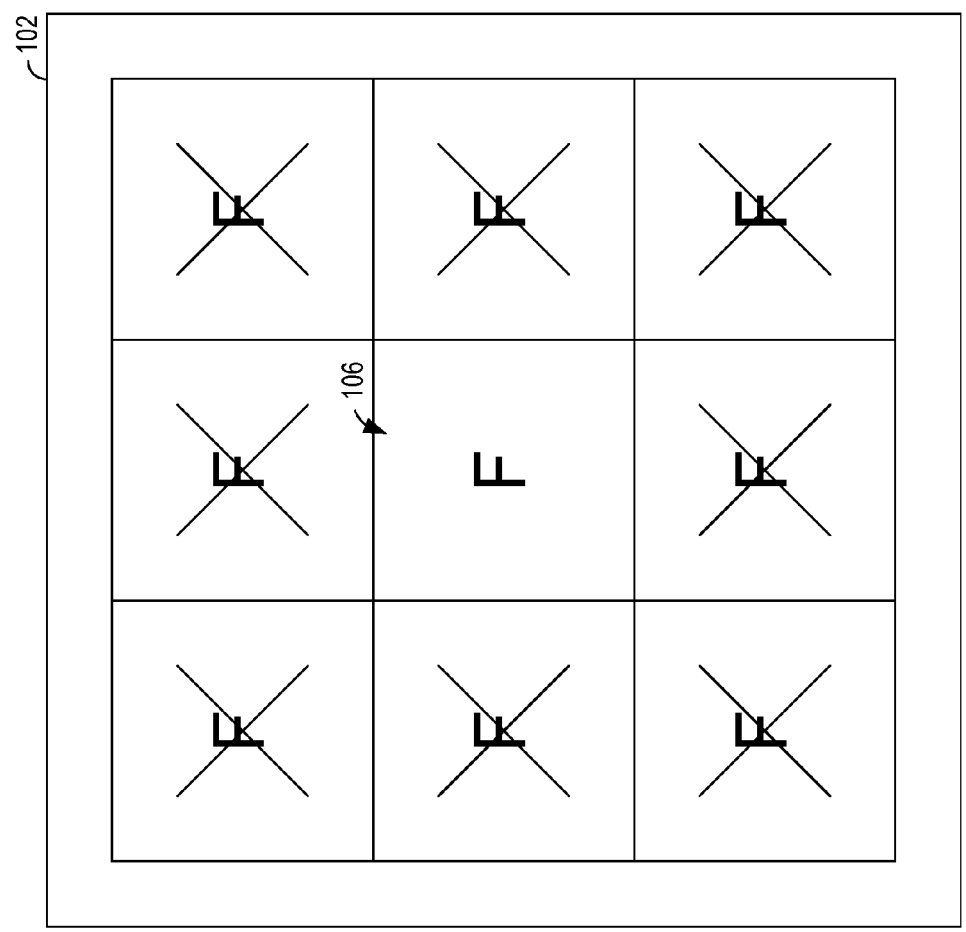

EA-SLMs are often pixelated devices with square pixels placed on a regular array. A spatially quantized device, with rows and columns of pixels, will typically form a central diffraction pattern and repetitions of this pattern in the horizontal and vertical axes. These orders are formed because of aliasing; any regularly sampled signal will have its spectrum repeated at a frequency equal to the sampling frequency. For example, FIG. 1 schematically shows a representation of an aliased image 102 produced by a hologram 104. As illustrated, the central, or desired, image 106 (e.g., the box with the letter "F" in the middle) is repeated as unwanted diffraction orders (e.g., as indicated by the "X" through the duplicated boxes) along horizontal and vertical axes of the image 102 (e.g., above, below, and to the side of the central, desired image). These repetitions of the central spectrum/signal are referred to as higher orders. The higher orders may be on the far field of the EA-SLM (e.g., Fourier plane) or an intermediate plane. The central or the desired image may lay on the far field plane and/or an intermediate plane and can be on the same plane or a different plane from the higher orders.

The higher orders would have the same intensity as the central image if the pixels had an infinitesimal size; e.g., if pixels were effectively point sources. However, as pixel size is finite, the diffraction pattern reduces in amplitude further away from the central order. This is called aperture theorem and in the specific case of Fraunhofer/Fourier holograms with square pixels, the image is multiplied by a sinc function, usually referred to as the sinc envelope. The higher orders are usually unwanted side effect of a diffractive system. In all cases, light is lost and efficiency reduced. In some cases, the higher orders may interfere with the central and wanted image and additional steps are used to remove the high orders. For example, some approaches to reduce diffraction and remove unwanted higher order images include utilizing an aperture stop (e.g., focusing the output of the system on an aperture that only allows the wanted orders to pass through), providing angular filters (e.g., to filter out the unwanted orders), and performing pixel oversampling (e.g., creating a spatial light modulator with a much higher spatial frequency than needed in order to oversample the digital hologram with more pixels—for example, a single pixel may be replaced with an array of pixels in an oversampled SLM). However, each of these approaches may make the system larger, more complex and increase its cost.

The present disclosure provides an additional or alternative approach to removing unwanted higher orders in images produced by a phase modulating device. The pixel oversampling approach described above may reduce or remove unwanted orders by shrinking the pixel size such that the fringing fields between pixels and the resistance of a phase modulating layer (e.g., a liquid crystal director) to deformation serve to reduce sharp phase transitions between adjacent pixels such that the phase profile behaves similarly to a spatially continued function. Essentially, a low-pass filter is created on the hologram, which removes higher spatial frequencies and reduces or removes higher orders. The approach of the present disclosure similarly relates to the fringing fields and resistance of the phase modulating layer in a phase modulating device in order to reduce or remove higher orders of diffraction in an output image, but reduces complexity in the backplane of the device relative to the pixel oversampling example described above. According to the present disclosure, further smoothing (or low pass filtering) of phase distribution in the phase modulating device is achieved by introducing a layer of material on top of pixel electrodes, the material configured to blur or smooth phase transitions in the phase modulating layer of the phase modulating device by blurring or smoothing the electric field generated due to the voltage drop between the pixel electrodes and the common electrodes. Properties of the blurring material may depend on the type and configuration of the phase modulating device in which the blurring material is included. Example configurations of phase modulating devices including blurring material for reducing or removing higher orders of diffraction in images produced by the phase modulating devices are described below.

Figure 2:
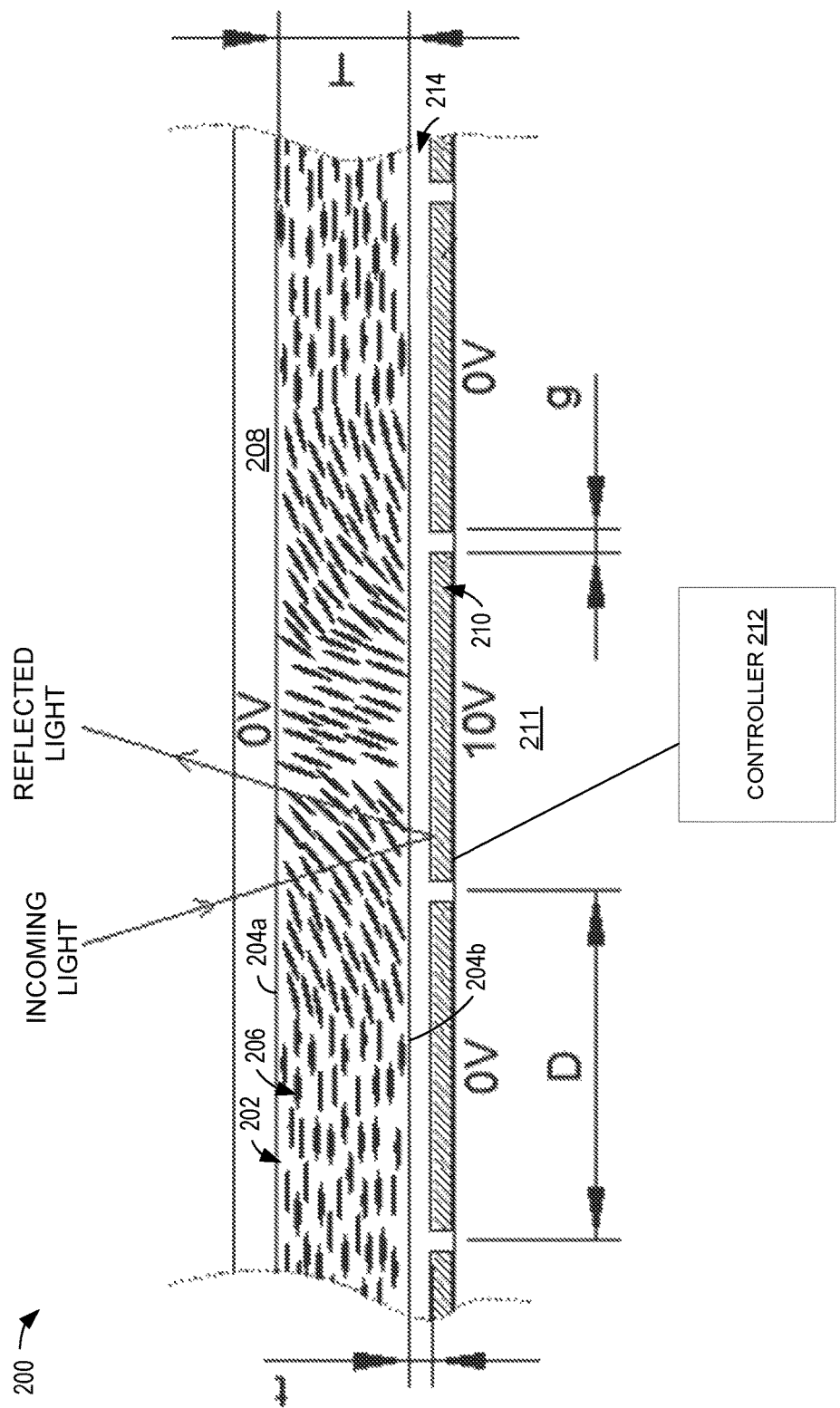
FIG. 2 shows a cross-sectional view of a first example phase modulating device.

FIG. 2 shows a cross section of a first example phase modulating device 200. The phase modulating device 200 includes a phase modulating layer 202 having first and second opposing sides, 204a and 204b, respectively. In the illustrated example, the phase modulating layer 202 includes a liquid crystal layer that has nematic liquid crystals 206 disposed therein. The phase modulating device 200 further includes a common electrode 208 adjacent the first side 204a of the phase modulating layer and a plurality of pixel electrodes 210 adjacent the second side 204b of the phase modulating layer 202 and disposed on a backplane 211 (e.g., a silicon backplane). Accordingly, for each of the plurality of pixel electrodes 210, application of a voltage to that pixel electrode (e.g., via a controller 212) produces a voltage drop between that pixel electrode and the common electrode 208 across a respective localized area of the phase modulating layer 202. The voltage drop is based on the differential voltage between the common electrode and the associated pixel electrode. In the illustrated example, there is no or negligible voltage drop between the 0V pixel electrodes and the common electrode. However, there is a voltage drop between the 10V pixel electrode and the common electrode. It is to be understood that the voltages shown in the illustrated examples are exemplary in nature, and any suitable voltages may be applied to the associated electrodes.

As shown, the voltage drop between the 10V pixel electrode and the common electrode produces an electric field that changes the orientation of the liquid crystals 206 above the 10V pixel electrode, creating a localized area of phase modulation. As discussed above, sharp phase transitions from pixel to pixel in the phase modulating layer 202 may result in the production of unwanted higher orders of diffraction in an image produced by the phase modulating device.

Accordingly, the phase modulating device 200 further includes a blurring material 214 disposed between the phase modulating layer 202 and the pixel electrodes 210. The blurring material may form a layer configured to smooth phase transitions in the phase modulating layer between the localized areas associated with the pixel electrodes. The blurring material effectively shifts the phase modulating layer further away from the pixel electrodes, such that the electric field and voltage potential change more gradually between the pixels. Furthermore, the blurring material may include material that has a larger electrical permeability than air, such that the blurring of the electrical field between adjacent pixels may occur over a small thickness of the material while the voltage drop between the pixel and the top electrode is minimized. An example of a blurring material that provides good balance between maximizing resolution and minimizing voltage drop is Lead Zirconate Titanate (PZT), with relative permittivity between a few hundreds and a few thousands. The effect of the blurring of the electrical field between pixel electrodes is that the liquid crystals of the phase modulating layer rotate more slowly between localized pixel electrode regions (relative to rotation when no blurring layer is present), effectively interpolating the phase between two pixels.

A thickness of the phase modulating layer 202 is shown at "T" and a thickness of the blurring material 214 is shown at "t" in FIG. 2. For maximizing the voltage drop across the phase modulating layer, the voltage drop over the thickness of the blurring material is minimised. Therefore the ratio of thickness versus permittivity may be at least 100 times more for the blurring material than the phase modulating layer. In other words, the blurring material may be configured such that:

$$\varepsilon_p/t > 100 * \varepsilon_{LC}/T,$$

where $\varepsilon_p$ is the permittivity of the blurring material and $\varepsilon_{LC}$ is the permittivity of the phase modulating layer. Additionally, for effective transmission of the electric field between neighbouring electrodes the blurring material may be configured such that the following is satisfied:

$$\varepsilon_p > 10 \times \varepsilon_{LC}.$$

The pixel electrodes 210 have a pixel pitch by which the pixel electrodes are distributed along the second side 204b of the phase modulating layer 202. An example measurement of pixel pitch is shown by "D" in FIG. 2, which measures the distance between a center of an inter-pixel gap (a gap between adjacent pixel electrodes, an example of which is shown by "g" in FIG. 2) on opposing sides of a given pixel electrode. In other examples, pixel pitch may be measured from a first edge of a first pixel electrode to a first edge of a second, adjacent, pixel electrode, or from a center of the first pixel electrode to a center of the second, adjacent pixel electrode.

In order to provide effective blurring of the electrical field and phase modulation in the phase modulating layer, large gaps between the pixel electrodes may be provided. This is because the pixel electrode (being a conductor) imposes a potential similar to its own potential in its surrounding area/volume. The large gaps may be achieved by including narrower pixel electrodes. For example, the pixel electrodes may be sized and distributed such that the ratio of the inter-pixel gap to the pixel pitch is between 0.50 and less than 1.0. Having very narrow pixel electrodes creates a larger transition area and the attenuation for higher orders increases (e.g., relative to wider pixel electrodes).

Figure 3:
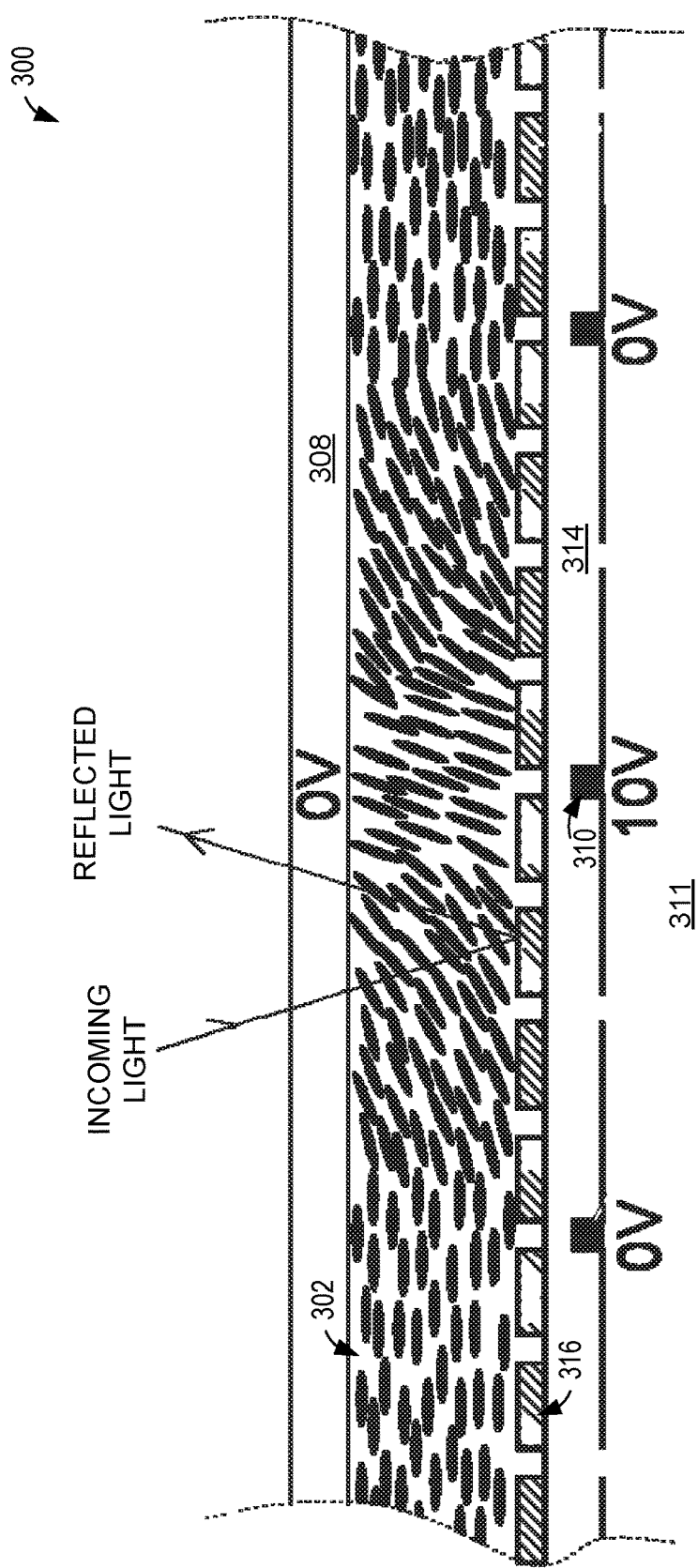
FIG. 3 shows a cross-sectional view of a second example phase modulating device including a plurality of reflective elements.

FIG. 3 shows a cross-sectional view of a second example phase modulating device 300 that includes narrow electrodes. The phase modulating device 300 may include similar elements to those described above with respect to FIG. 2. For example, the phase modulating device 300 may include a phase modulating layer 302, a common electrode 308, pixel electrodes 310 disposed on a backplane 311, and blurring material 314. These elements may be similar to the commonly-named elements of FIG. 2. Accordingly, some or all of the associated description of the elements of FIG. 2 may apply to the associated elements of FIG. 3. However, in reflective phase modulating devices, the smaller pixel electrodes of FIG. 3 (relative to those of FIG. 2) may decrease the area acting as a mirror to reflect incoming light. In order to provide additional reflective surfaces, the phase modulating device 300 may further include a plurality of reflective elements 316, disposed between the blurring material 314 and the phase modulating layer 302, to reflect incoming light.

Figure 4:
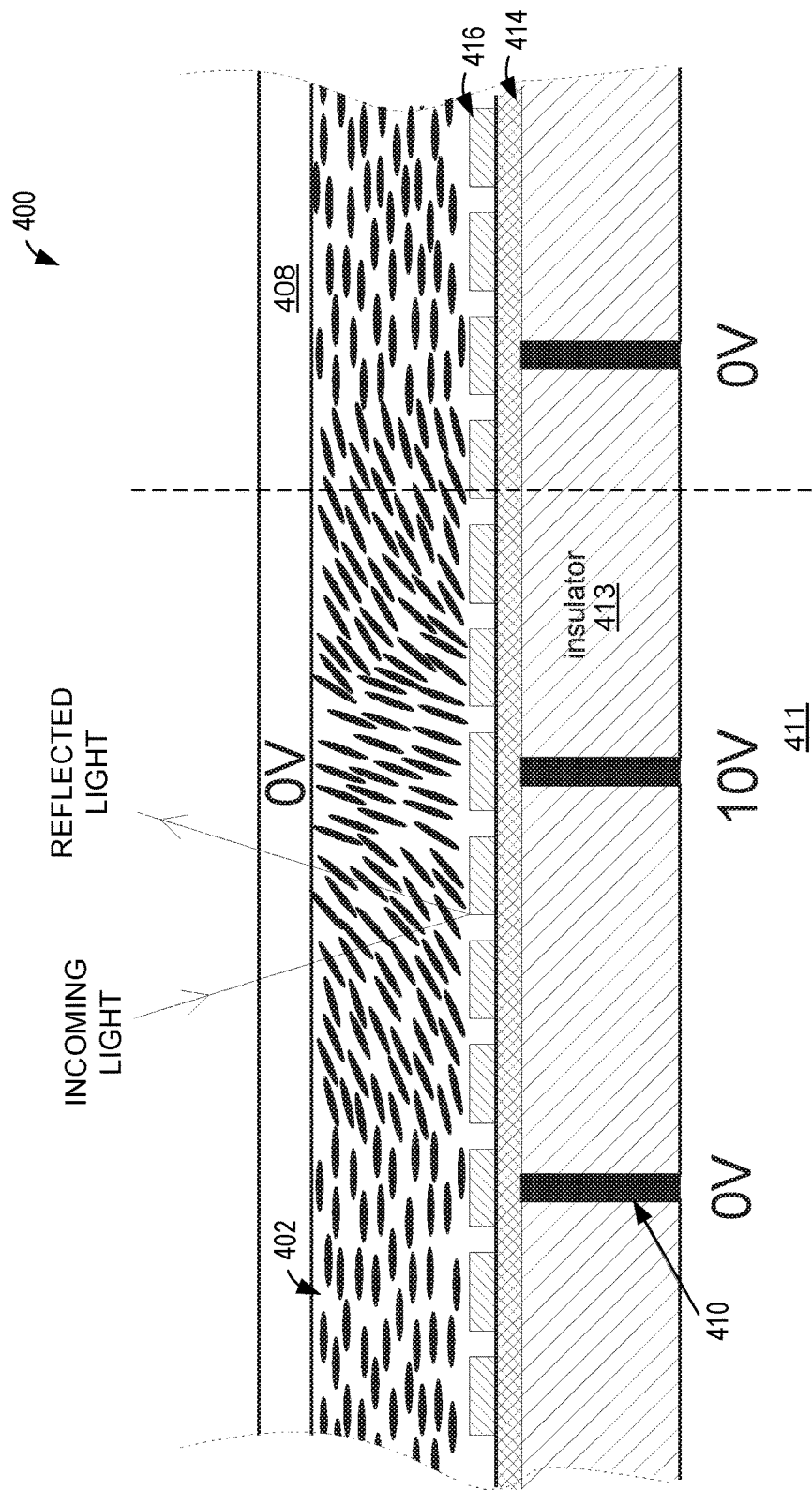
FIG. 4 shows a cross-sectional view of a third example phase modulating device including material between the pixel electrodes, a layer of high permittivity material on top of them and a plurality of reflective elements disposed over top of the pixel electrodes.

Another approach to achieving the large inter-pixel gap described above includes utilizing tall and thin pixel electrodes in a phase modulating device. FIG. 4 shows a cross-sectional view of a third example phase modulating device 400 including tall and thin pixel electrodes 410. The phase modulating device 400 may include similar elements to those described above with respect to FIGS. 2 and 3. For example, the phase modulating device 400 may include a phase modulating layer 402, a common electrode 408, pixel electrodes 410 disposed on a backplane 411, and blurring material 414 similarly to FIGS. 2 and 3, and a plurality of reflective elements 416 similarly to FIG. 3. These elements may be similar to the commonly-named elements of FIGS. 2 and 3. Accordingly, some or all of the associated description of the elements of FIGS. 2 and 3 may apply to the associated elements of FIG. 4.

The pixel electrodes 410 of FIG. 4 may be composed of different materials, such as carbon nano-tubes (CNT). In order to control interference between the electrical fields of adjacent pixel electrodes, inter-pixel gaps between the pixel electrodes may be filled with and/or may include insulating material 413, which may be non-reflective or minimally-reflective. The insulator may ensure that the electrodes are not short circuited. For example, insulating material may include SiO2 (Silica), which has a low relative permittivity (e.g., approximately 3.9). Each of the pixel electrodes may have a height (e.g., in a dimension along/parallel to an optical axis 418 that passes from the backplane 411 to the common electrode 408) that is greater than a width (e.g., a dimension perpendicular to the optical axis 418) of the electrode. One or more of the pixel electrodes 410 may be approximately the same height as the thickness of the insulating material in the inter-pixel gaps in some examples. In additional or alternative examples, one or more of the pixel electrodes 410 may be shorter than the insulating material of the inter-pixel gaps, such that insulating material or other material is provided between the pixel electrode(s) and the blurring material 414. In further additional or alternative examples, one or more of the pixel electrodes 410 may be taller than the insulating material of the inter-pixel gaps, such that the pixel electrode(s) protrude into the blurring material layer.

The pixel electrodes of the example of FIG. 4 may cause the voltage gradient on the lower surface/side of the LC to vary more linearly (between electrodes because electrodes are thin), relative to devices with wider electrodes. The thickness of the blurring material may be kept into a minimum, since the E-field in the blurring material is not affected by an underlying electrode, resulting in a faster (relative to systems with thicker blurring material) phase modulation response in the phase modulating layer upon application of voltage to the pixel electrodes. Furthermore, by keeping the thickness of the blurring material small, the transition region is nearly the size of the pixel pitch (e.g., g/D is closer to unity than in other examples). By minimizing the thickness of the blurring material, the voltage for the phase modulating layer is maximized, as there is less voltage drop across the blurring material. For example, the blurring material may have a thickness that is maintained below 1 μm. After deposition of the insulator and terminals (e.g., intersections of the pixel electrodes with the backplane) of the pixel electrodes, polishing may be used to make the surface of this region of the phase modulating device into an optically flat surface (e.g., upon which the blurring material may be applied).

Figure 5:
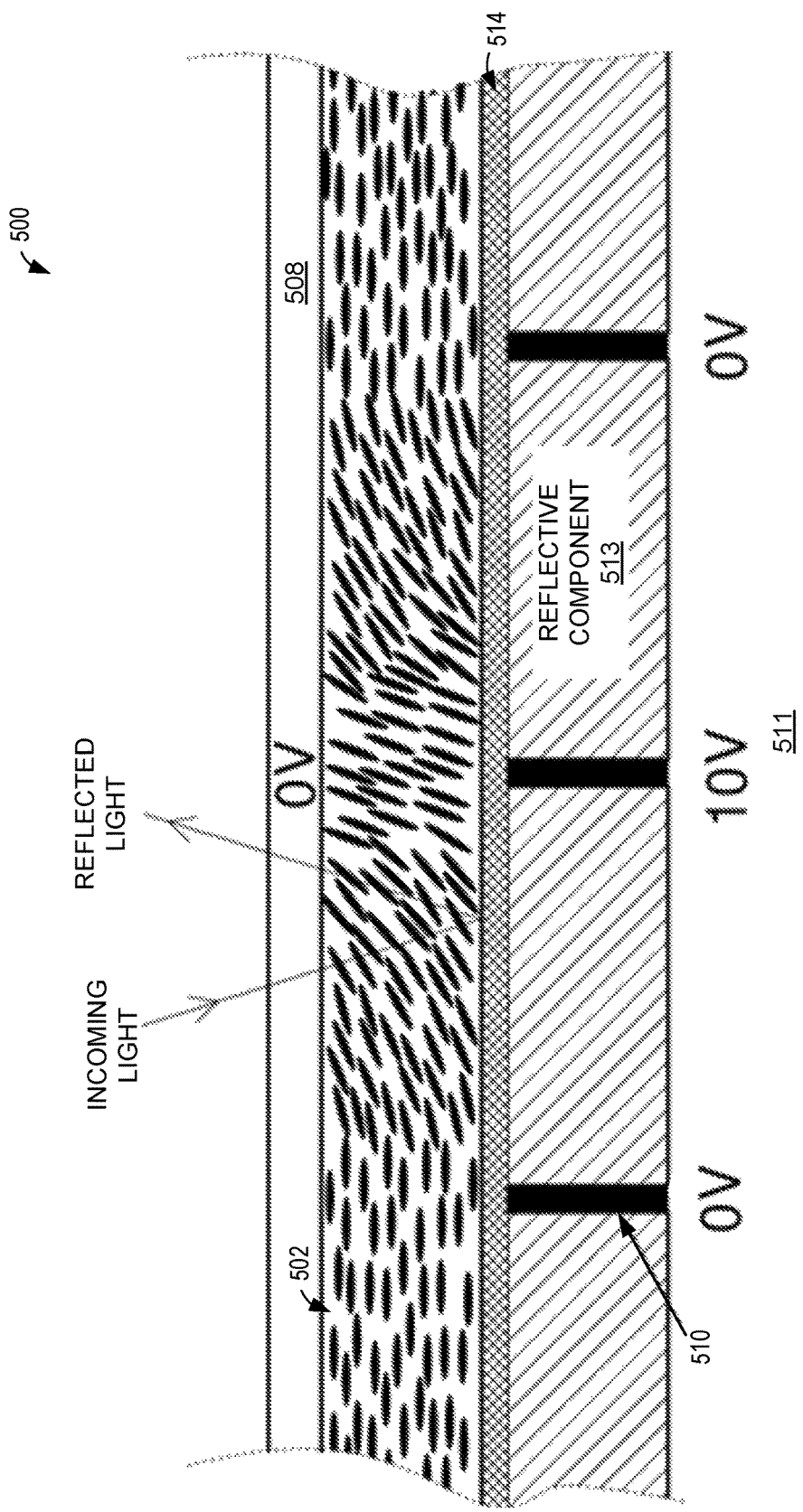
FIG. 5 shows a cross-sectional view of a fourth example phase modulating device including pixel electrodes with reflective material disposed between them.

Another example approach includes disposing a reflective material in between pixel electrodes in order to remove the separate layer of reflective elements between the blurring material and the phase modulating layer. FIG. 5 shows a cross-sectional view of a fourth example phase modulating device 500 including tall and thin pixel electrodes with reflective material disposed between the pixel electrodes. The phase modulating device 500 may include similar elements to those described above with respect to FIG. 4. For example, the phase modulating device 500 may include a phase modulating layer 502, a common electrode 508, pixel electrodes 510 disposed on a backplane 511, and blurring material 514. These elements may be similar to the commonly-named elements of FIG. 4. Accordingly, some or all of the associated description of the elements of FIG. 4 may apply to the associated elements of FIG. 5.

However, in contrast to the insulating material of FIG. 4, some or all of the inter-pixel gaps between pixel electrodes of the phase modulating device 500 of FIG. 5 may include a reflective component 513, such as a dielectric mirror and/or quarter waveplate. The reflective component may reflect incoming light so that additional reflective elements may be removed (e.g., the reflective elements 416 of FIG. 4 are not included in the device of FIG. 5). Disposing the reflective material between the pixel electrodes may increase the resolution of the device and increase the voltage drive available for the device, relative to devices that dispose reflective material on top of the pixel electrodes.

Although the above examples a presented as two-dimensional structures for illustrative purposes, the phase modulating devices may extend in three dimensions, such that the electrodes and/or other structures shown in the figures may extend in the third dimension as a single element (e.g., as a single stripe) or as an array of elements/structures. Additionally, although reflective phase modulating devices are shown, similar features may be included in transmissive phase modulating devices. If the device is transmissive, all the layers will be transparent. If the device is reflective, the bottom layer will be reflective and all the subsequent layers transparent. All layers may be deposited as a continued uniform layer or as patterned smaller structures. The latter is useful if a layer is to act as a mirror but is configured to have varied voltage across its surface.

Another example provides for an image forming system with a phase modulating device, including a phase modulating layer having first and second opposing sides, a common electrode adjacent the first side of the phase modulating layer, a plurality of pixel electrodes adjacent the second side of the phase modulating layer, where for each of the plurality of pixel electrodes, application of a voltage to that pixel electrode produces a voltage drop between that pixel electrode and the common electrode across a respective localized area of the phase modulating layer, where the pixel electrodes have a pixel pitch by which the pixel electrodes are distributed along the second side of the phase modulating layer, where the pixel electrodes are separated from one another by an inter-pixel gap, where the ratio of the inter-pixel gap to the pixel pitch is between 0.50 and 1.0, and the phase modulating device further comprising a blurring material disposed between the phase modulating layer and the pixel electrodes, the blurring material configured to smooth phase transitions in the phase modulating layer between the localized areas associated with the pixel electrodes. In such an example, a ratio of the permittivity of the blurring material to the thickness of the blurring material may additionally or alternatively be greater than 100 times the ratio of the permittivity of the phase modulating layer to the thickness of the phase modulating layer. In such an example, each of the plurality of pixel electrodes may additionally or alternatively be disposed on a silicon backplane and wherein the phase modulating layer includes a liquid crystal layer. In such an example, the blurring material may additionally or alternatively include a dielectric mirror. In such an example, the blurring material may additionally or alternatively comprise Lead Zirconate Titanate (PZT). In such an example, the image forming system may additionally or alternatively further comprise a plurality of reflective elements disposed between the blurring material and the phase modulating layer. In such an example, a dielectric mirror may additionally or alternatively be disposed within at least one inter-pixel gap. In such an example, a quarter waveplate may additionally or alternatively be disposed within at least one inter-pixel gap. In such an example, insulating material may additionally or alternatively be disposed within at least one inter-pixel gap. In such an example, the pixel electrodes may additionally or alternatively comprise carbon nano-tubes. In such an example, the height of each pixel electrode may additionally or alternatively be less than a thickness of material disposed within the inter-pixel gaps. In such an example, at least one pixel electrode may additionally or alternatively protrude into the blurring material. Any or all of the above-described examples may be combined in any suitable manner in various implementations.

Another example provides for a phase modulating device, comprising a liquid crystal layer having first and second opposing sides, a common electrode adjacent the first side of the liquid crystal layer, a plurality of pixel electrodes adjacent the second side of the liquid crystal layer, where for each of the plurality of pixel electrodes, application of a voltage to that pixel electrode produces a voltage drop between that pixel electrode and the common electrode across a respective localized area of the liquid crystal layer, where the pixel electrodes have a pixel pitch by which the pixel electrodes are distributed along the second side of the liquid crystal layer, where the pixel electrodes are separated from one another by an inter-pixel gap, where the ratio of the inter-pixel gap to the pixel pitch is between 0.5 and 1.0, where insulating material is disposed within at least one of the inter-pixel gaps, the phase modulating device further comprising a blurring material disposed between the liquid crystal layer and the pixel electrodes, the blurring material configured to smooth phase transitions in the liquid crystal layer between the localized areas associated with the pixel electrodes, and the phase modulating device further comprising a plurality of reflective elements disposed between the blurring material and the second side of the liquid crystal layer. In such an example, the blurring material may additionally or alternatively comprise Lead Zirconate Titanate (PZT). In such an example, the height of each pixel electrode may additionally or alternatively be less than a thickness of the insulating material disposed within the at least one inter-pixel gap. In such example, at least one pixel electrode may additionally or alternatively protrude into the blurring material. In such an example, the pixel electrodes may additionally or alternatively include carbon nano-tubes. Any or all of the above-described examples may be combined in any suitable manner in various implementations.

Another example provides for a phase modulating device, comprising a liquid crystal layer having first and second opposing sides, a common electrode adjacent the first side of the liquid crystal layer, a plurality of pixel electrodes adjacent the second side of the liquid crystal layer, where for each of the plurality of pixel electrodes, application of a voltage to that pixel electrode produces a voltage drop between that pixel electrode and the common electrode across a respective localized area of the liquid crystal layer, where the pixel electrodes have a pixel pitch by which the pixel electrodes are distributed along the second side of the liquid crystal layer, where the pixel electrodes are separated from one another by an inter-pixel gap, where the ratio of the inter-pixel gap to the pixel pitch is between 0.50 and less than 1.0, where one or more of a dielectric mirror and a quarter waveplate is disposed within at least one of the inter-pixel gaps, and the phase modulating device further comprising a blurring material disposed between the liquid crystal layer and the pixel electrodes, the blurring material configured to smooth phase transitions in the liquid crystal layer between the localized areas associated with the pixel electrodes. In such an example, the blurring material may additionally or alternatively comprise Lead Zirconate Titanate (PZT). In such an example, the pixel electrodes may additionally or alternatively include carbon nano-tubes. Any or all of the above-described examples may be combined in any suitable manner in various implementations.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An image forming system with a phase modulating device, comprising:
    a phase modulating layer having first and second opposing sides;
    a common electrode adjacent the first side of the phase modulating layer;
    a plurality of pixel electrodes adjacent the second side of the phase modulating layer, where for each of the plurality of pixel electrodes, application of a voltage to that pixel electrode produces a voltage drop between that pixel electrode and the common electrode across a respective localized area of the phase modulating layer;
    where the pixel electrodes have a pixel pitch by which the pixel electrodes are distributed along the second side of the phase modulating layer;
    where the pixel electrodes are separated from one another by an inter-pixel gap, where the ratio of the inter-pixel gap to the pixel pitch is between 0.50 and 1.0; and
    the phase modulating device further comprising a blurring material disposed between the phase modulating layer and the pixel electrodes, the blurring material having a higher permittivity than the phase modulating layer, and configured to smooth phase transitions of a liquid crystal state in the phase modulating layer between the localized areas associated with the pixel electrodes.

2. The image forming system of claim 1, wherein a ratio of the permittivity of the blurring material to the thickness of the blurring material is greater than 100 times the ratio of the permittivity of the phase modulating layer to the thickness of the phase modulating layer.

3. The image forming system of claim 1, wherein each of the plurality of pixel electrodes is disposed on a silicon backplane and wherein the phase modulating layer includes a liquid crystal layer.

4. The image forming system of claim 1, wherein the blurring material includes a dielectric mirror.

5. The image forming system of claim 1, wherein the blurring material comprises Lead Zirconate Titanate (PZT).

6. The image forming system of claim 1, further comprising a plurality of reflective elements disposed between the blurring material and the phase modulating layer.

7. The image forming system of claim 1, wherein a dielectric mirror is disposed within at least one inter-pixel gap.

8. The image forming system of claim 1, wherein a quarter waveplate is disposed within at least one inter-pixel gap.

9. The image forming system of claim 1, wherein insulating material is disposed within at least one inter-pixel gap.

10. The image forming system of claim 1, wherein the pixel electrodes comprise carbon nano-tubes.

11. The image forming system of claim 1, wherein the height of each pixel electrode is less than a thickness of material disposed within the inter-pixel gaps.

12. The image forming system of claim 1, wherein at least one pixel electrode protrudes into the blurring material.

13. A phase modulating device, comprising:
a liquid crystal layer having first and second opposing sides;
a common electrode adjacent the first side of the liquid crystal layer;
a plurality of pixel electrodes adjacent the second side of the liquid crystal layer, where for each of the plurality of pixel electrodes, application of a voltage to that pixel electrode produces a voltage drop between that pixel electrode and the common electrode across a respective localized area of the liquid crystal layer;
where the pixel electrodes have a pixel pitch by which the pixel electrodes are distributed along the second side of the liquid crystal layer;
where the pixel electrodes are separated from one another by an inter-pixel gap, where the ratio of the inter-pixel gap to the pixel pitch is between 0.5 and 1.0;
where insulating material is disposed within at least one of the inter-pixel gaps;
the phase modulating device further comprising a blurring material disposed between the liquid crystal layer and the pixel electrodes, the blurring material having a higher permittivity than the liquid crystal layer, and configured to smooth phase transitions of a liquid crystal state in the liquid crystal layer between the localized areas associated with the pixel electrodes; and
the phase modulating device further comprising a plurality of reflective elements disposed between the blurring material and the second side of the liquid crystal layer.

14. The phase modulating device of claim 13, wherein the blurring material comprises Lead Zirconate Titanate (PZT).

15. The phase modulating device of claim 13, wherein the height of each pixel electrode is less than a thickness of the insulating material disposed within the at least one inter-pixel gap.

16. The phase modulating device of claim 13, wherein at least one pixel electrode protrudes into the blurring material.

17. The phase modulating device of claim 13, wherein the pixel electrodes include carbon nano-tubes.

18. A phase modulating device, comprising:
a liquid crystal layer having first and second opposing sides;
a common electrode adjacent the first side of the liquid crystal layer;
a plurality of pixel electrodes adjacent the second side of the liquid crystal layer, where for each of the plurality of pixel electrodes, application of a voltage to that pixel electrode produces a voltage drop between that pixel electrode and the common electrode across a respective localized area of the liquid crystal layer;
where the pixel electrodes have a pixel pitch by which the pixel electrodes are distributed along the second side of the liquid crystal layer;
where the pixel electrodes are separated from one another by an inter-pixel gap, where the ratio of the inter-pixel gap to the pixel pitch is between 0.50 and less than 1.0;
where one or more of a dielectric mirror and a quarter waveplate is disposed within at least one of the inter-pixel gaps; and
the phase modulating device further comprising a blurring material disposed between the liquid crystal layer and the pixel electrodes, the blurring material having a higher permittivity than the liquid crystal layer, and configured to smooth phase transitions of a liquid crystal state in the liquid crystal layer between the localized areas associated with the pixel electrodes.

19. The phase modulating device of claim 18, wherein the blurring material comprises Lead Zirconate Titanate (PZT).

20. The phase modulating device of claim 18, wherein the pixel electrodes include carbon nano-tubes.

* * * * *